(12) United States Patent
Suzuki et al.

(10) Patent No.: US 9,609,247 B2
(45) Date of Patent: Mar. 28, 2017

(54) SOLID-STATE IMAGING DEVICE PERFORMING FEED-FORWARD CONTROL OF MULTIPLICATION FACTOR OF MULTIPLICATION REGISTER TO MATCH DYNAMIC RANGE OF THE DEVICE WITH THE INTENSITY DISTRIBUTION OF INCIDENT LIGHT

(75) Inventors: Hisanori Suzuki, Hamamatsu (JP); Yasuhito Yoneta, Hamamatsu (JP); Shin-ichiro Takagi, Hamamatsu (JP); Kentaro Maeta, Hamamatsu (JP); Masaharu Muramatsu, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 284 days.

(21) Appl. No.: 13/144,741

(22) PCT Filed: Jan. 22, 2010

(86) PCT No.: PCT/JP2010/050818
§ 371 (c)(1),
(2), (4) Date: Jul. 15, 2011

(87) PCT Pub. No.: WO2010/087288
PCT Pub. Date: Aug. 5, 2010

(65) Prior Publication Data
US 2011/0273603 A1    Nov. 10, 2011

(30) Foreign Application Priority Data
Jan. 30, 2009 (JP) .................................. 2009-020475

(51) Int. Cl.
*H04N 5/372* (2011.01)
*H01L 27/146* (2006.01)
*H01L 27/148* (2006.01)

(52) U.S. Cl.
CPC ... *H04N 5/37213* (2013.01); *H01L 27/14609* (2013.01); *H01L 27/14812* (2013.01)

(58) Field of Classification Search
USPC .......................................... 348/312, 321, 311
See application file for complete search history.

(56) References Cited

U.S. PATENT DOCUMENTS 6,444,968 B1 *  9/2002  Burt .................. H01L 27/14806
                                                        250/208.1
2002/0191093 A1 * 12/2002 Hynecek ....................... 348/311
(Continued)

FOREIGN PATENT DOCUMENTS

EP    0866501    9/1998
EP    1081766    3/2001
(Continued)

OTHER PUBLICATIONS

U.S. Office Action dated Jun. 18, 2013 that issued in U.S. Appl. No. 13/144,727 including Double Patenting Rejections on pp. 2-3.

*Primary Examiner* — Shahbaz Nazrul
(74) *Attorney, Agent, or Firm* — Drinker Biddle & Reath LLP

(57) ABSTRACT

A solid-state imaging device 1 according to one embodiment of the present invention is a charge multiplying solid-state imaging device, and includes an imaging area 10 that generates a charge according to the amount of incident light, an output register unit 20 that receives the charge from the imaging area 10, and a multiplication register unit 28 that multiplies the charge from the output register 20, and performs feed-forward control of the multiplication factor of the multiplication register unit 28 according to the charge amount from the imaging area 10.

7 Claims, 14 Drawing Sheets

(56) References Cited

U.S. PATENT DOCUMENTS

| | | |
|---|---|---|
| 2003/0223531 A1 | 12/2003 | Kashima et al. |
| 2004/0150737 A1* | 8/2004 | Pool et al. ............... 348/311 |
| 2005/0056771 A1 | 3/2005 | Atlas et al. |
| 2005/0248676 A1* | 11/2005 | Christenson ............ 348/317 |
| 2007/0146521 A1* | 6/2007 | Robbins ................... 348/311 |
| 2008/0192882 A1 | 8/2008 | Lazovsky |
| 2008/0230680 A1 | 9/2008 | Yatokoro |
| 2008/0259197 A1* | 10/2008 | Ito et al. ................. 348/311 |
| 2008/0284892 A1* | 11/2008 | Ito et al. ................. 348/311 |
| 2008/0303933 A1* | 12/2008 | Kondo et al. ............ 348/311 |
| 2011/0272557 A1 | 11/2011 | Suzuki et al. |
| 2012/0154652 A1* | 6/2012 | Parks ....................... 348/300 |

FOREIGN PATENT DOCUMENTS

| | | |
|---|---|---|
| GB | 2431538 | 4/2007 |
| JP | 2003-9000 | 1/2003 |
| JP | 2003-158679 | 5/2003 |
| JP | 2005-159784 | 6/2005 |
| JP | 3862850 | 10/2006 |
| JP | 2007-124675 | 5/2007 |
| JP | 2008-177709 | 7/2008 |
| JP | 2008-236176 | 10/2008 |

* cited by examiner

SOLID-STATE IMAGING DEVICE PERFORMING FEED-FORWARD CONTROL OF MULTIPLICATION FACTOR OF MULTIPLICATION REGISTER TO MATCH DYNAMIC RANGE OF THE DEVICE WITH THE INTENSITY DISTRIBUTION OF INCIDENT LIGHT

TECHNICAL FIELD

The present invention relates to a charge multiplying type of solid-state imaging device such as an EM-CCD.

BACKGROUND ART

Charge-Coupled Devices (CCDs) have been widely known as solid-state imaging devices for taking images of incident light, and among the CCDs, an EM-CCD (Electron Multiplying-CCD) that enables taking an image of weak light has been known. This type of solid-state imaging device includes, in addition to an imaging area that includes a plurality of photodiodes or the like and generates charges according to the amount of incident light and an output register unit that reads out the charges of the imaging area, a multiplication register unit that multiplies the read-out charges, and enables taking an image of weak light by using a charge multiplication effect of the multiplication register unit. This type of solid-state imaging device has been disclosed in Patent Literatures 1 and 2.

The solid-state imaging devices described in Patent Literatures 1 and 2 control the multiplication factor (gain) of the multiplication register unit based on an output of the multiplication register unit, that is, perform feedback control of the multiplication factor of the multiplication register unit.

CITATION LIST

Patent Literature

Patent Literature 1: Japanese Patent No. 3862850
Patent Literature 2: Japanese Patent Laid-Open No. 2007-124675

SUMMARY OF INVENTION

Technical Problem

Meanwhile, when this type of solid-state imaging device is applied to a spectrometer or the like to be used for a spectroscopic measurement or the like, light made incident into the imaging area has an intensity distribution, and the intensity distribution of the incident light may exceed the dynamic range of the solid-state imaging device. Therefore, it is considered, in order to match the dynamic range of the solid-state imaging device to the intensity distribution of incident light, to control the multiplication factor of the multiplication register unit as in the solid-state imaging devices described in Patent Literatures 1 and 2.

However, in the solid-state imaging devices described in Patent Literatures 1 and 2, feedback control of the amplification factor of the amplification register unit is performed, and thus the multiplication factor of the multiplication register unit of a present timing is controlled based on an output of the multiplication register unit obtained at a previous timing. That is, the multiplication factor of the multiplication register unit is controlled for the amount of incident light at a present read-out position based on the amount of incident light at a read-out position of the previous timing in the imaging area. Therefore, the multiplication factor of the multiplication register unit cannot be appropriately controlled for the amount of incident light at the present read-out position, so that the dynamic range of the solid-state imaging device cannot be appropriately matched to the intensity distribution of the incident light.

Therefore, it is an object of the present invention to provide a solid-state imaging device capable of appropriately controlling the multiplication factor of the multiplication register unit.

Solution to Problem

A solid-state imaging device of the present invention is a charge multiplying solid-state imaging device, and includes an imaging area that generates a charge according to the amount of incident light, an output register unit that receives the charge from the imaging area, and a multiplication register unit that multiplies the charge from the output register unit, and performs feed-forward control of a multiplication factor of the multiplication register unit according to the charge amount from the imaging area.

According to this solid-state imaging device, since feed-forward control of the multiplication factor of the multiplication register unit is performed according to the charge amount from the imaging region, that is, the multiplication factor of the multiplication register unit is controlled in real time, the multiplication factor of the multiplication register unit can be appropriately controlled for the amount of incident light at a present read-out position in the imaging region. Therefore, the dynamic range of the solid-state imaging device can be appropriately matched to the intensity distribution of incident light.

The solid-state imaging device described above may further include a detection unit that detects the amount of charge to be input to the multiplication register unit, and a control unit that performs feed-forward control of the multiplication factor of the multiplication register unit according to the charge amount detected by the detection unit.

Moreover, the solid-state imaging device described above may further include a detection register unit that receives the charge from the imaging area, and a control unit that performs feed-forward control of the multiplication factor of the multiplication register unit according to the amount of charge output from the detection register unit. According to this configuration, since the detection register unit receives a charge from the imaging area similar to the output register unit, the amount of charge output from the detection register unit is the same as the amount of charge output from the output register unit, and is the same as the amount of charge to be input to the multiplication register unit.

Moreover, it is preferable that the solid-state imaging device described above further includes a delay register unit disposed between the output register unit and the multiplication register unit, for delaying charge transfer from the output register unit to the multiplication register unit. Alternatively, it is preferable that the solid-state imaging device described above further includes a delay register unit disposed between the detection unit and the multiplication register unit, for delaying charge transfer from the detection unit to the multiplication register unit.

According to this configuration, since the delay register unit delays charge transfer to the multiplication register unit, even when the control unit is slow in control speed, before a present read-out charge is input, the multiplication factor of the multiplication register unit can be appropriately controlled according to this charge amount.

Moreover, the control unit described above may control the multiplication factor of the multiplication register unit according to any of the maximum value, minimum value, and average value of the amount of charges detected by the detection unit. Alternatively, the control unit described above may control the multiplication factor of the multiplication register unit according to any of the maximum value, minimum value, and average value of the amount of charges output from the detection register unit.

Moreover, the detection unit described above may include a floating gate amplifier.

Another solid-state imaging device of the present invention is a charge multiplying solid-state imaging device, includes an imaging area that generates a charge according to the amount of incident light, a plurality of output register units that receive the charge from the imaging area, and a plurality of multiplication register units that multiply the charges from the output register units, respectively, and performs feed-forward control of multiplication factors of the multiplication register units, respectively, according to the amount of charges to be input to the multiplication register units, respectively.

According to this solid-state imaging device, since feed-forward control of the multiplication factor of the multiplication register unit described above is individually performed in each port of the multi-port solid-state imaging device, that is, real-time control of the multiplication factor of the multiplication register unit is individually performed in each port, the multiplication factor of the multiplication register unit can be appropriately controlled for the amount of incident light at a present read-out position in the imaging region. Therefore, the dynamic range of the solid-state imaging device can be appropriately matched to the intensity distribution of incident light.

Advantageous Effects of Invention

According to the present invention, the multiplication factor of the multiplication register unit can be appropriately controlled for the amount of incident light at a present read-out position. As a result, the dynamic range of the solid-state imaging device can be appropriately matched to the intensity distribution of incident light.

DESCRIPTION OF EMBODIMENTS

Figure 1:
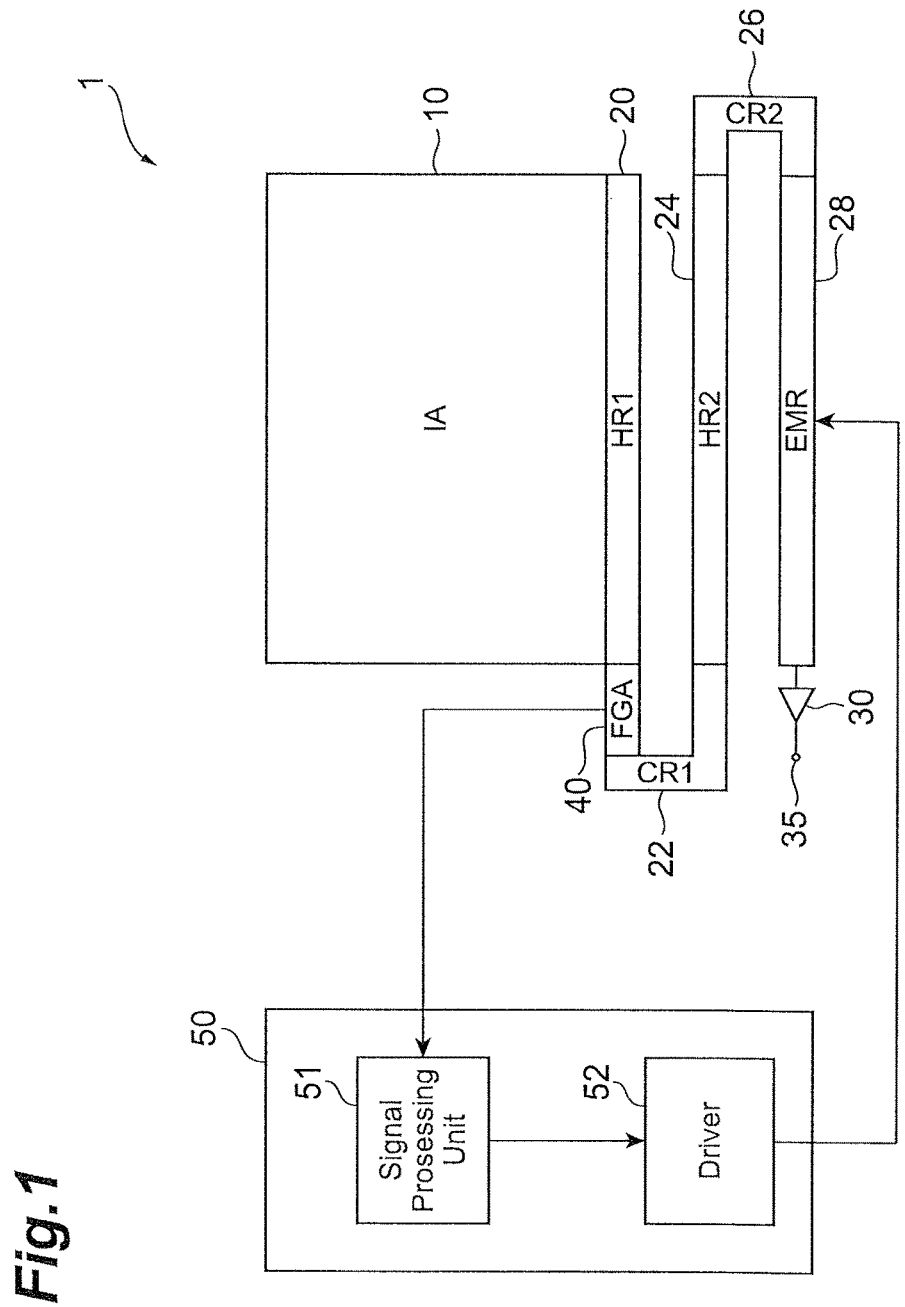
FIG. 1 is a diagram showing a configuration of a solid-state imaging device according to a first embodiment of the present invention.

Hereinafter, preferred embodiments of the present invention will be described in detail with reference to the drawings. Also, the same or corresponding parts will be denoted with the same reference numerals in the drawings.

First Embodiment

FIG. 1 is a diagram showing a configuration of a solid-state imaging device according to a first embodiment of the present invention. The solid-state imaging device 1 shown in FIG. 1 is a charge multiplying solid-state imaging device, and includes an imaging area (IA) 10, a first horizontal register unit (HR1) 20, a first corner register unit (CR1) 22, a second horizontal register unit (HR2) 24, a second corner register unit (CR2) 26, a multiplication register unit (EMR) 28, an amplifier 30, an output port 35, a detection unit 40, and a control unit 50. Here, the first horizontal register unit 20 corresponds to an output register described in the scope of claims, and the second horizontal register unit 24 corresponds to a delay register described in the scope of claims.

The imaging area 10 is for taking an image of incident light, and contains a plurality of pixel units. Each pixel unit has a photodiode that generates charge of an amount according to the amount of incident light, and a charge accumulating unit that accumulates the charge. Each pixel unit performs, in response to a clock having a periodic pulsed voltage, in-pixel charge transfer from the photodiode to the charge accumulating unit, charge transfer from the charge accumulating unit to the first horizontal register unit 20, and the like.

The first horizontal register unit 20 includes a plurality of horizontal registers horizontally arrayed corresponding to every vertical line of the imaging area 10, and in response to a clock having a periodic pulsed voltage, sequentially transfers charges of each horizontal register to the first corner register unit 22 via the detection unit 40.

Similar to the first horizontal register unit 20, the first corner register unit 22 includes a plurality of registers connected in series, and in response to a clock having a periodic pulsed voltage, sequentially transfers charges sequentially transferred from the first horizontal register unit 20 to the second horizontal register unit 24.

Similarly, the second horizontal register unit 24 includes a plurality of horizontal registers connected in series, and in response to a clock having a periodic pulsed voltage, sequentially transfers charges sequentially transferred from the first corner register unit 22 to the second corner register unit 26.

Similarly, the second corner register unit 26 includes a plurality of registers connected in series, and in response to a clock having a periodic pulsed voltage, sequentially transfers charges sequentially transferred from the second horizontal register unit 24 to the multiplication register unit 28. In the present embodiment, the first and second corner register units 22 and 26 are provided for folding back in a charge transfer direction with the aim of a reduction in mounting space, but can be omitted when the charge transfer direction of the second horizontal register unit 24 is not folded back with respect to the first horizontal register unit 20.

Figure 2:
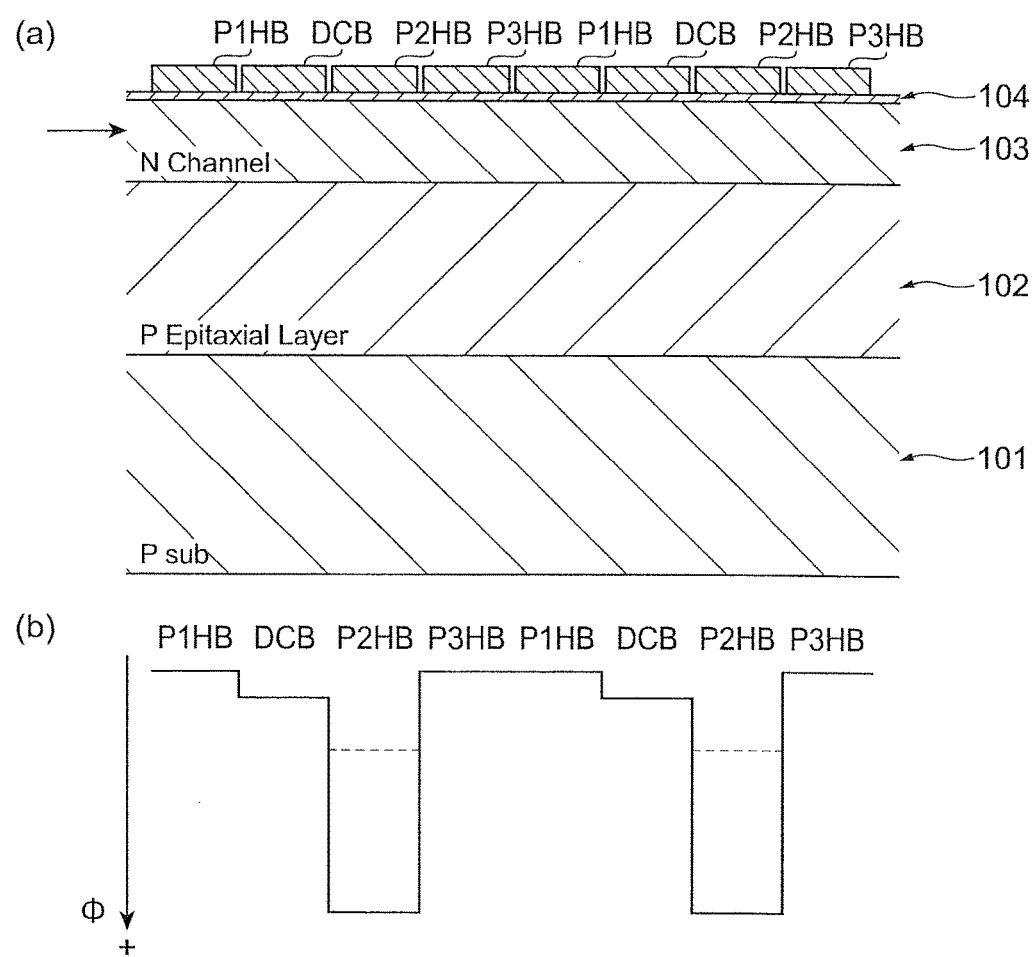
FIG. 2 includes views showing a sectional structure of a multiplication register unit shown in FIG. 1, and energy potential in a multiplying operation.

The multiplication register unit 28 includes a plurality of multiplication registers, multiplies the charges sequentially transferred from the second corner register unit 26, and outputs the charges to the amplifier 30. FIG. 2 shows a sectional structure of a multiplication register unit and energy potential in a multiplying operation. As shown in FIG. 2(*a*), each multiplication register is formed by sequentially arraying four electrodes P1HB, DCB, P2HB, and P3HB on a layered structure for which a p-type epitaxial layer 102, an n-type channel layer 103, and an oxide film 104 are sequentially stacked on a p-type substrate 101, and these multiplication registers are arrayed in a plural number to form the multiplication register unit 28. To the electrodes PH1B, P2HB, and P3HB, clocks having periodic pulsed voltages are sequentially applied. Moreover, to the electrode DCB, a direct-current voltage is applied. Also, the arrow in FIG. 2(*a*) indicates a charge transfer direction.

First, when a pulsed voltage (clock) of a value larger than that of a direct-current voltage of the electrode DCB is applied to the electrode P1HB, the energy potential of a channel layer part below the electrode P1HB becomes higher than that of a channel layer part below the electrode DCB (downward in FIG. 2(*b*)), and a potential well is produced in the channel layer part below the electrode P1HB, to which a charge is transferred from a channel layer part below the electrode P3HB located at the side opposite to the charge transfer direction of the electrode P1HB, and retained.

Next, when the pulsed voltage of the electrode P1HB lowers, and a pulsed voltage (clock) of a high voltage value is applied to the electrode P2HB, the energy potential of the channel layer part below the electrode P1HB becomes lower than that of the channel layer part below the electrode DCB (upward), and the energy potential of a channel layer part below the electrode P2HB becomes greater and higher than that of the channel layer part below the electrode DCB (downward), that is, becomes higher than an energy potential for normal transfer (the dotted line in FIG. 2(*b*)). Then, a charge is transferred to the channel layer part below the electrode DCB, and thereafter, a charge is transferred to the channel layer part below the electrode P2HB. At this time, charge multiplication is performed by an impact ionization effect.

Next, when the pulsed voltage of the electrode P2HB lowers, and a pulsed voltage (clock) is applied to the electrode P3HB, the energy potential of the channel layer part below the electrode P2HB becomes lower than that of the channel layer part below the electrode P3HB (upward), and a charge is transferred to the channel layer part below the electrode P3HB.

In this way, in each multiplication register, charge multiplication is to be performed in the process of charge transfer. Since the charge multiplication effect by an impact ionization effect per one stage of multiplication register is small, the multiplication register unit 28 has approximately several hundred stages of multiplication registers, for example.

Moreover, in each multiplication register, by changing the direct-current voltage value to be applied to the electrode DCB, and the pulsed voltage value to be applied to the electrode P2HB, the multiplication factor by an impact ionization effect can be changed.

Returning to FIG. 1, the amplifier 30 amplifies as well as converts a charge transferred from the multiplication register unit 28 to a voltage signal, and outputs the signal to the output port 35.

Figure 3:
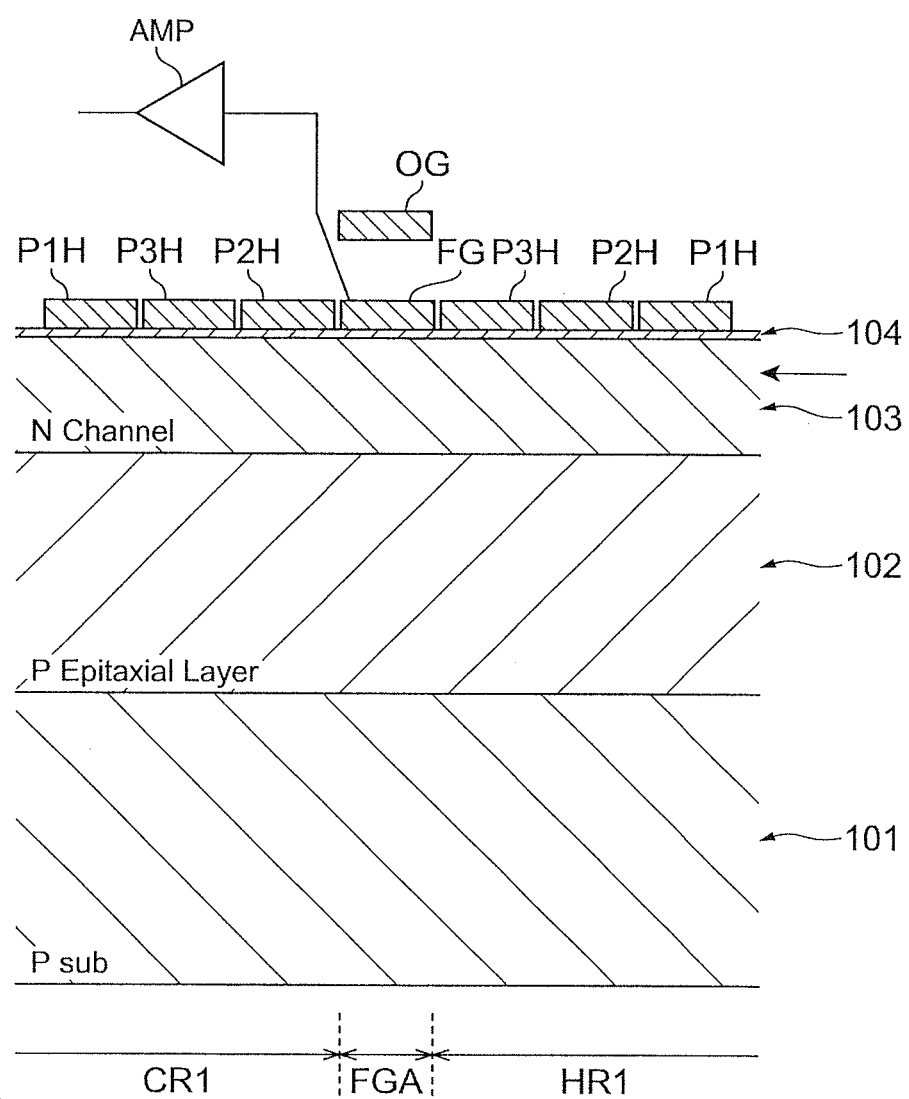
FIG. 3 is a view showing a sectional structure of a floating gate amplifier shown in FIG. 1.

The detection unit 40 detects the amount of charge output from the first horizontal register unit 20 to thereby detect the amount of charge to be input to the multiplication register unit 28. In the present embodiment, a floating gate amplifier (hereinafter, referred to as an FGA) is used as the detection unit 40. FIG. 3 is a view showing a sectional structure of the FGA. Also, in FIG. 3, a part of the first horizontal register unit (HR1) 20 of a previous stage and a part of the first corner register unit (CR1) 22 of a subsequent stage are shown along with the FGA. Moreover, the arrow in FIG. 3 indicates a charge transfer direction.

Similar to the first horizontal register unit 20 and the first corner register unit 22, the FGA 40 is formed by disposing a floating gate electrode FG on a layered structure for which a p-type epitaxial layer 102, an n-type channel layer 103, and an oxide film 104 are sequentially stacked on a p-type substrate 101. In the present embodiment, one of the electrodes P1H in the first corner register unit 22 is used as the floating gate electrode FG. Moreover, the FGA 40 has a control electrode OG disposed above the floating gate electrode FG. Further, the FGA 40 has an amplifier AMP that receives a voltage generated in the floating gate electrode FG and supplies the voltage to the control unit 50.

In this FGA 40, when a clock having a periodic pulsed voltage is applied to the control electrode OG, the energy potential of a channel layer part below the control electrode OG becomes high, and a charge is transferred. Then, a voltage according to this charge is generated in the floating gate electrode FG, and this voltage is output via the amplifier AMP.

Here, a floating diffusion amplifier (hereinafter, referred to as an FDA) that performs charge detection is known similar to the FGA. In the FDA, a transfer charge converted to a detection voltage is discharged to its reset drain to vanish. That is, the FDA destructively performs detection for the transfer charge. On the other hand, the FGA performs detection with a transfer charge retained, that is, nondestructively performs detection for the transfer charge, which is thus referred to as a nondestructive method.

Returning to FIG. 1, this control unit 50 includes a signal processing unit 51 and a driver 52. The signal processing unit 51 determines a transfer timing of the above-described clocks to be supplied to the imaging area 10, the first horizontal register unit 20, the detection unit 40, the first corner register unit 22, the second horizontal register unit 24, the second corner register unit 26, and the multiplication register unit 28. The driver 52 generates clocks according to this transfer timing, and supplies these clocks to the respective units, respectively.

Moreover, the signal processing circuit 51, based on voltage values sequentially supplied from the detection unit 40, determines the voltage values of a clock and a direct-current voltage to be supplied to the multiplication register unit 28. For example, the signal processing circuit 51 determines any of the maximum value, minimum value, and average value of detection voltages corresponding to the amount of charge for one horizontal line. Then, the signal processing circuit 51 determines the pulsed voltage value of a clock to be applied to the electrode P2HB of the multiplication register unit 28 and the direct-current voltage value to be applied to the electrode DCB of the multiplication register unit 28, if the value of detection voltage is large, so as to reduce the multiplication factor of the multiplication register unit 28, and if the value of detection voltage is small, so as to increase the multiplication factor of the multiplication register unit 28.

The driver 52 generates a clock for the electrode P2HB having a pulsed voltage according to the value determined by the signal processing unit 51 and a direct-current voltage for the electrode DCB having a voltage according to the value determined by the signal processing unit 51, and supplies the clock and voltage to the multiplication register unit 28.

In this way, the control unit 50 performs feed-forward control of the multiplication factor of the multiplication register unit 28 according to the amount of charge output from the first horizontal register unit 20, that is, according to the amount of charge to be input to the multiplication register unit 28, so as to allow matching the dynamic range of the solid-state imaging device 1 to the intensity distribution of incident light.

Figure 4:
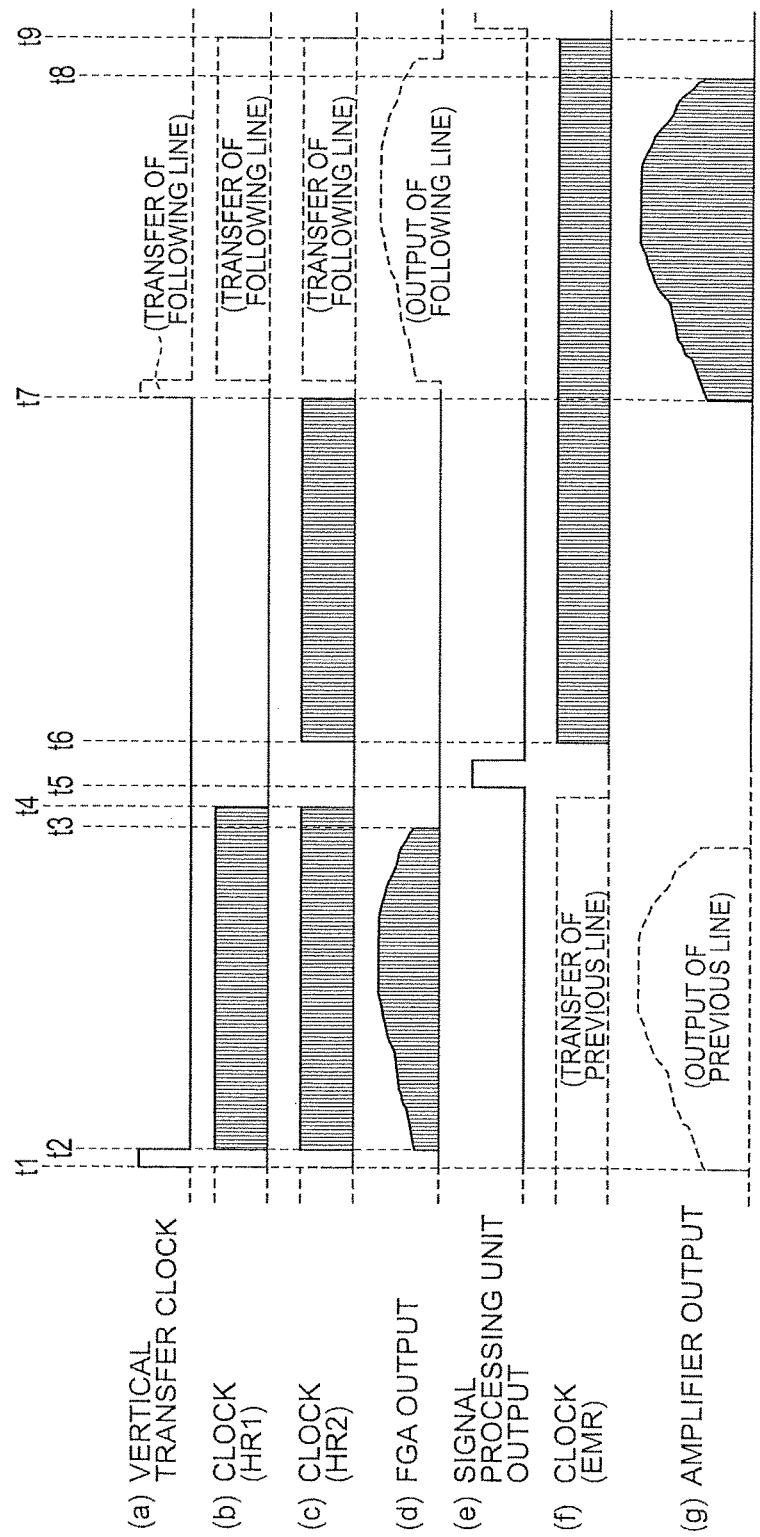
FIG. 4 is a timing chart showing waveforms of the solid-state imaging device shown in FIG. 1.

Next, description will be given of the operation of the solid-state imaging device 1 of the present embodiment. FIG. 4 is a timing chart showing waveforms of the solid-state imaging device of the present embodiment.

First, in time t1 to t2, when a vertical transfer clock is input to the imaging area 10 (a), a charge of one horizontal line in the imaging region 10 is transferred to the first horizontal register unit 20. Next, in time t2 to t4, when a clock is input to the first horizontal register unit 20, the detection unit 40, and the first corner register unit 22 (b), and a clock is input to the second horizontal register unit 24 and the second corner register unit 26 (c), charges of each horizontal register in the first horizontal register unit 20 are sequentially transferred to each horizontal register in the second horizontal register unit 24.

In that case, in time t2 to t3, a voltage according to a transfer charge is detected by the detection unit 40, and supplied to the control unit 50 (d). Then, by the signal processing unit 51, voltage values of a clock and a direct-current voltage to be supplied to the multiplication register unit 28 are determined based on voltage values sequentially supplied from the detection unit 40, and a control signal representing these voltage values is output at time t5 (e). Specifically, the signal processing circuit 51 determines the pulsed voltage value of a clock to be applied to the electrode P2HB of the multiplication register unit 28 and the direct-current voltage value to be applied to the electrode DCB of the multiplication register unit 28, if the value of detection voltage is large, so as to reduce the multiplication factor of the multiplication register unit 28, and if the value of detection voltage is small, so as to increase the multiplication factor of the multiplication register unit 28. Thereafter, by the driver 52, a clock for the electrode P2HB having a pulsed voltage according to the determined value and a direct-current voltage for the electrode DCB having a voltage according to the value determined by the signal processing unit 51 are generated.

Then, in t6 to t9, the clock and direct-current voltage are supplied to the multiplication register unit 28 from the driver 52 (f), and in time t6 to t7, the clock is input to the second horizontal register unit 24. Then, in time t6 to t7, charges of each horizontal register in the second horizontal register unit 24 are sequentially transferred to each multiplication register in the multiplication register unit 28. Thereafter, in time t7 to t8, charges of each multiplication register in the multiplication register unit 28 are sequentially output to the amplifier 30, and output from the output port (g). In addition, the period of time t8 to t9 in the clock of the multiplication register unit 28 shown in FIG. 4(f) is an over clock period.

Here, the control unit 50, while the charge is retained in the second horizontal register unit 24 (FIG. 4(c), time t2 to t4), determines the multiplication factor of the multiplication register unit 28 according to that charge amount (FIG. 4(e), time t5). That is, the control unit 50, before the charge is input to the multiplication register unit 28 (FIG. 4(f), time t6), determines the multiplication factor of the multiplication register unit 28 according to that charge amount (FIG. 4(e), time t5).

In addition, at time t7, transfer of a charge of next one horizontal line in the imaging region 10 to the first horizontal register unit 20 is started, and the operation described above is repeated.

Thus, according to the solid-state imaging device 1 of the first embodiment, since feed-forward control of the multiplication factor of the multiplication register unit 28 is performed according to the amount of charge to be input to the multiplication register unit 28, that is, the multiplication factor of the multiplication register unit 28 is controlled in real time, the multiplication factor of the multiplication register unit 28 can be appropriately controlled for the amount of incident light at a present read-out position in the imaging region 10. Therefore, the dynamic range of the solid-state imaging device 1 can be appropriately matched to the intensity distribution of incident light.

Moreover, according to the solid-state imaging device 1 of the first embodiment, since the second horizontal register unit 24 delays charge transfer to the multiplication register unit 28, even when the control unit 50 is slow in control speed, before a present read-out charge is input, the multiplication factor of the multiplication register unit 28 can be appropriately controlled according to this charge amount.

Second Embodiment

Figure 5:
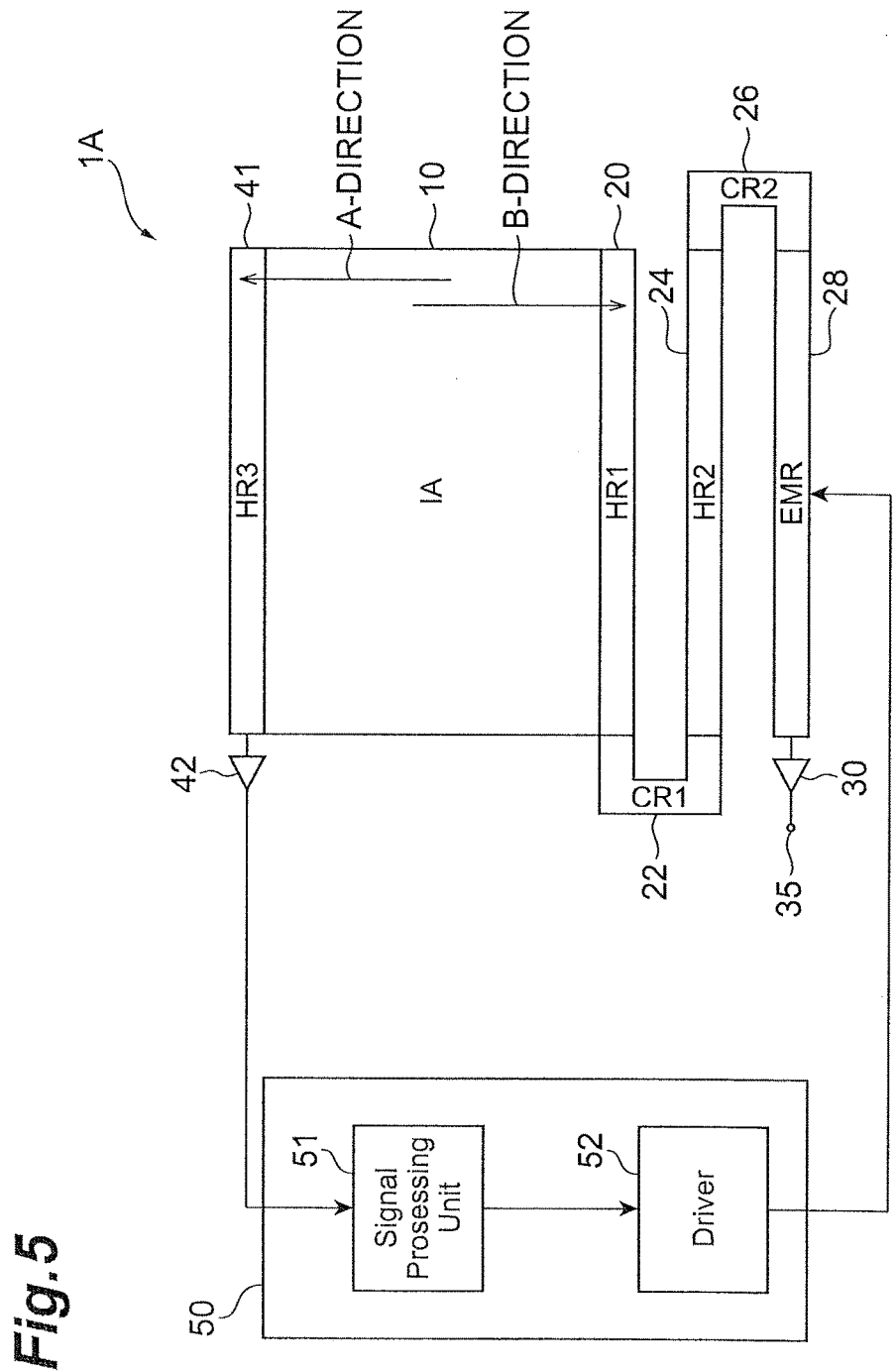
FIG. 5 is a diagram showing a configuration of a solid-state imaging device according to a second embodiment of the present invention.

FIG. 5 is a diagram showing a configuration of a solid-state imaging device according to a second embodiment of the present invention. The solid-state imaging device 1A shown in FIG. 5 includes a third horizontal register unit (HR3) 41 and an amplifier 42 in place of the detection unit 40 in the solid-state imaging device 1. Here, the third horizontal register unit 41 corresponds to a detection register described in the scope of claims.

In this second embodiment, each pixel unit in the imaging area 10 can also perform charge transfer to the third horizontal register unit 41 (A-direction) in addition to charge transfer to the first horizontal register unit 20 (B-direction). That is, the imaging area 10 is capable of bidirectional charge transfer.

The third horizontal register unit 41 is the same as the first horizontal register unit 20, and includes a plurality of horizontal registers horizontally arrayed corresponding to every vertical line of the imaging area 10, and in response to a clock having a periodic pulsed voltage, sequentially transfers charges of each horizontal register to the amplifier 42.

The amplifier 42 amplifies as well as converts the charge transferred from the third horizontal register unit 41 to a voltage signal, and outputs the signal to the control unit 50.

The signal processing unit 51 in the control unit 50 determines the voltage values of a clock and a direct-current voltage to be supplied to the multiplication register unit 28 based on, in place of detection voltages from the control unit 40, voltage values sequentially supplied from the third horizontal register unit 41 and the amplifier 42.

According to the solid-state imaging device 1A of the second embodiment, the third horizontal register unit 41 receives the same charge as that of the first horizontal register unit 20 and outputs that charge amount, and the control unit 50 controls the multiplication factor of the multiplication register unit 28 according to this charge amount, and thus the same advantages as those of the solid-state imaging device 1 of the first embodiment can be obtained.

In the following, one example of the operation of the solid-state imaging device 1A of the second embodiment corresponding to a variety of forms of imaging areas will be shown.

(Example 1 of Line Solid-State Imaging Device)

Figure 6:
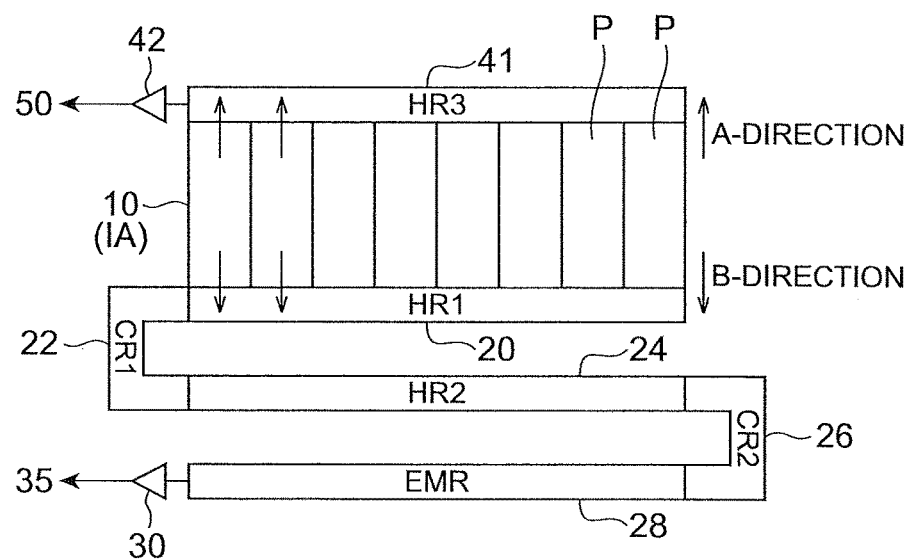
FIG. 6 is a diagram showing a partial configuration of Example 1 of a line solid-state imaging device.
Figure 7:
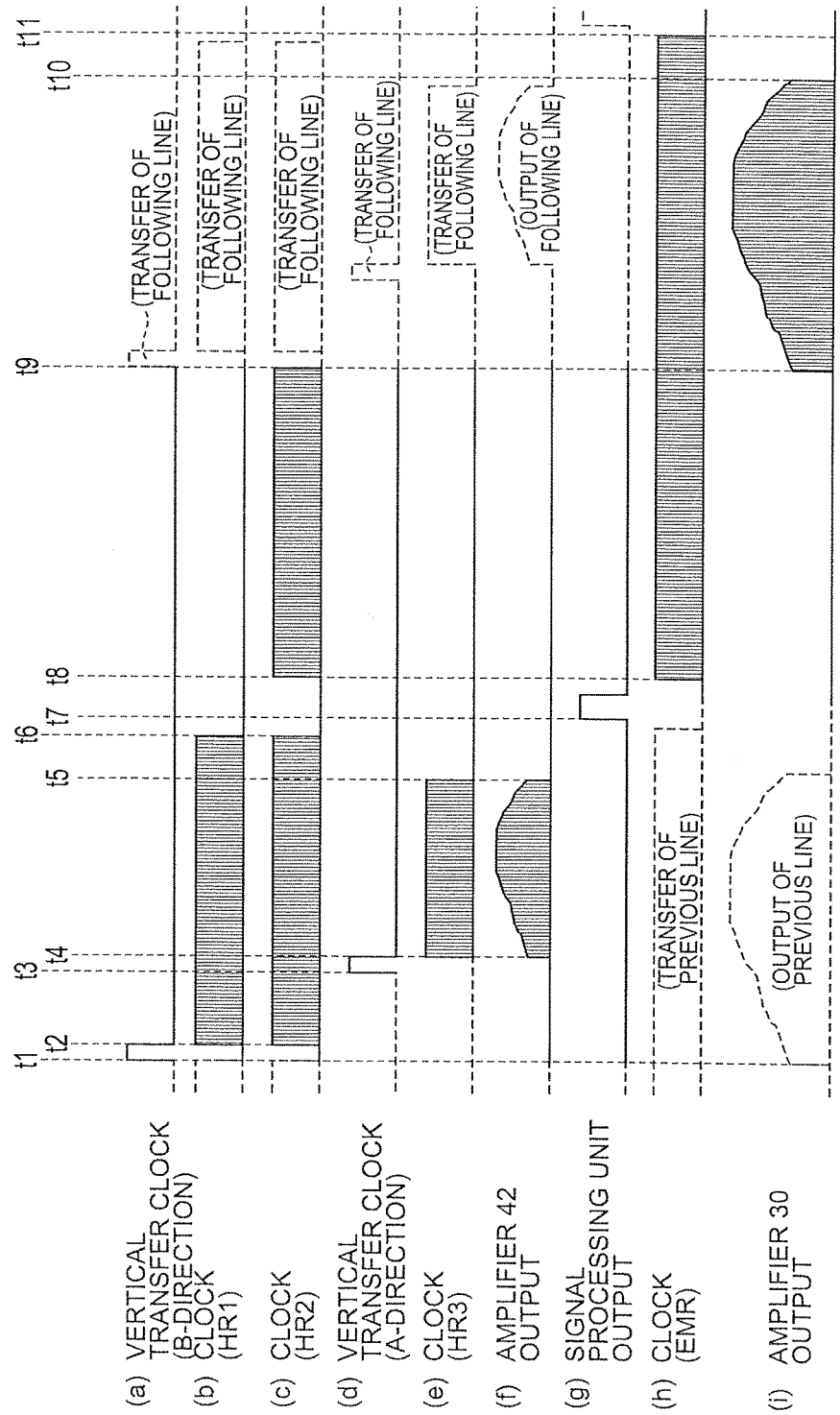
FIG. 7 is a timing chart showing waveforms of the line solid-state imaging device shown in FIG. 6.

FIG. 6 is a diagram showing a partial configuration of Example 1 of a line solid-state imaging device, and FIG. 7 is a timing chart showing waveforms of this line solid-state imaging device.

In the line solid-state imaging device shown in FIG. 6, the imaging area 10 contains a plurality of horizontally arrayed pixel units P, and each pixel unit P is capable of bidirectional charge transfer in the B-direction toward the first horizontal register unit 20 and the A-direction toward the third horizontal register unit 41.

Referring to FIG. 7, description will be given of the operation of this line solid-state imaging device.

First, in time t1 to t2, when a vertical transfer clock for transfer in the B-direction is input to the imaging area 10 (a), a charge of one horizontal line in the imaging region 10 is transferred to the first horizontal register unit 20. Next, in time t2 to t6, when a clock is input to the first horizontal register unit 20 and the first corner register unit 22 (b), and a clock is input to the second horizontal register unit 24 and the second corner register unit 26 (c), charges of each horizontal register in the first horizontal register unit 20 are sequentially transferred to each horizontal register in the second horizontal register unit 24.

In that case, in time t3 to t4, when a vertical transfer clock for transfer in the A-direction is input to the imaging area 10 (d), a charge of the same one horizontal line in the imaging region 10 is transferred to the third horizontal register unit 41. Next, in time t4 to t5, when a clock is input to the third horizontal register unit 41 (e), charges of each horizontal register in the third horizontal register unit 41 are sequentially transferred to the control unit 50 via the amplifier 42 (f). In addition, the charge transfer of the third horizontal register unit 41 is performed at a higher speed than that of the first horizontal register unit 20.

Then, as described above, by the signal processing circuit 51, based on voltage values sequentially supplied from the third horizontal register unit 41 and the amplifier 42, the pulsed voltage value of a clock to be applied to the electrode P2HB of the multiplication register unit 28 and the direct-current voltage value to be applied to the electrode DCB are determined, and a control signal representing these voltage values is output at time t7 (g). Thereafter, by the driver 52, a clock for the electrode P2HB having a pulsed voltage according to the determined value and a direct-current voltage for the electrode DCB having a voltage according to the value determined by the signal processing unit 51 are generated.

Then, in t8 to t11, the clock and direct-current voltage are supplied to the multiplication register unit 28 from the driver 52 (h), and in time t8 to t9, the clock is input to the second horizontal register unit 24. Then, in time t8 to t9, charges of each horizontal register in the second horizontal register unit 24 are sequentially transferred to each multiplication register in the multiplication register unit 28. Thereafter, in time t9 to t10, charges of each multiplication register in the multiplication register unit 28 are sequentially output to the amplifier 30, and output from the output port (i). In addition, the period of time t10 to t11 in the clock of the multiplication register unit 28 shown in FIG. 7(h) is an over clock period.

Here, the control unit 50, while the charge is retained in the second horizontal register unit 24 (FIG. 7(c), time t2 to t6), determines the multiplication factor of the multiplication register unit 28 according to that charge amount (FIG. 7(g), time t7). That is, the control unit 50, before the charge is input to the multiplication register unit 28 (FIG. 7(h), time t8), determines the multiplication factor of the multiplication register unit 28 according to that charge amount (FIG. 7(g), time t7).

In addition, at time t9, transfer of a charge of next one horizontal line in the imaging region 10 to the first horizontal register unit 20 is started, and the operation described above is repeated.

(Example 2 of Line Solid-State Imaging Device)

Figure 8:
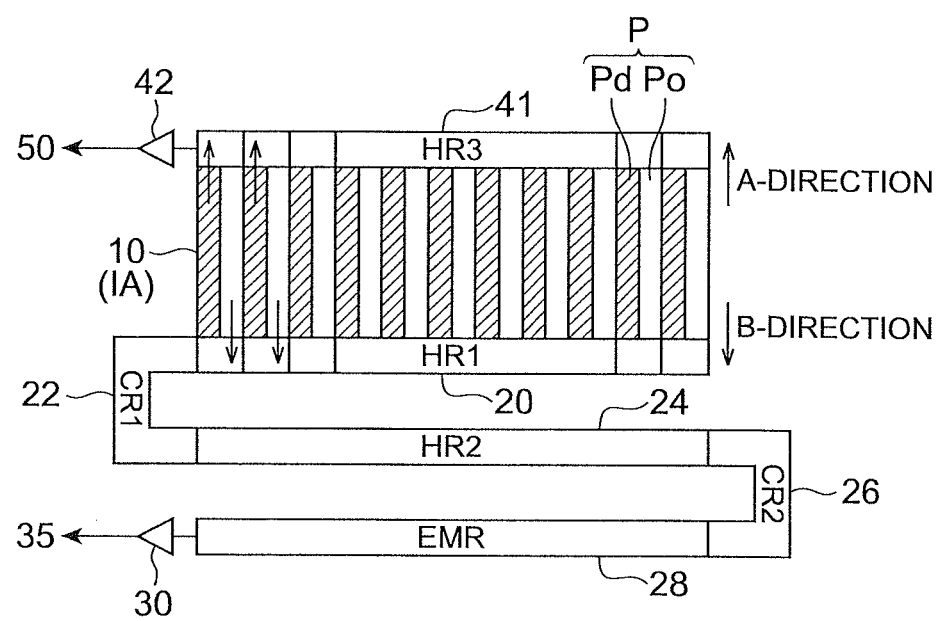
FIG. 8 is a diagram showing a partial configuration of Example 2 of a line solid-state imaging device.
Figure 9:
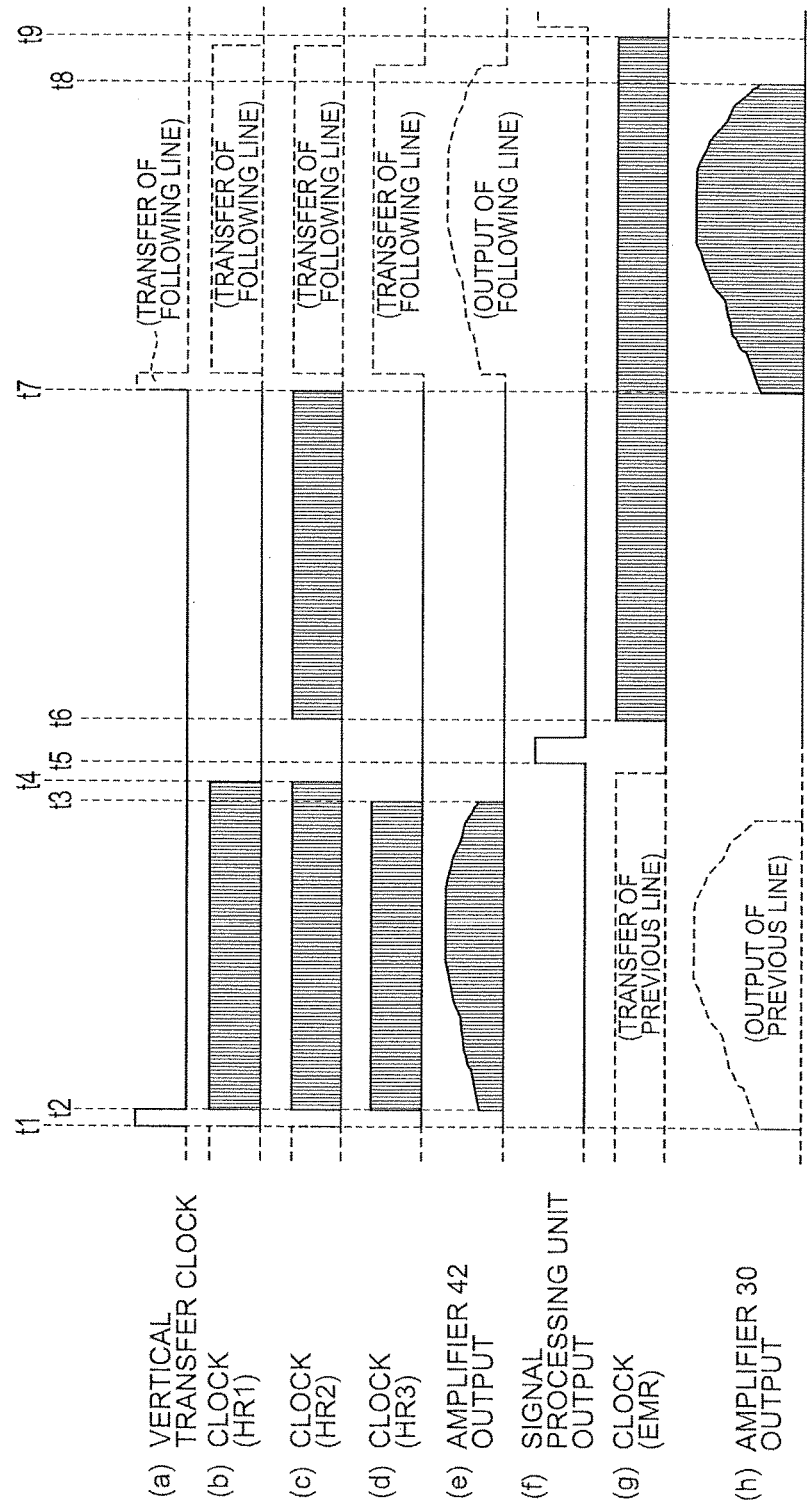
FIG. 9 is a timing chart showing waveforms of the line solid-state imaging device shown in FIG. 8.

FIG. 8 is a diagram showing a partial configuration of Example 2 of a line solid-state imaging device, and FIG. 9 is a timing chart showing waveforms of this line solid-state imaging device.

In the line solid-state imaging device shown in FIG. 8, the imaging area 10 contains a plurality of horizontally arrayed pixel units P, and each pixel unit P contains an outputting pixel Po and a detecting pixel Pd that are horizontally divided. The outputting pixel Po performs charge transfer in the B-direction of the first horizontal register unit 20 and the detecting pixel Pd performs charge transfer in the A-direction of the third horizontal register unit 41. In this way, each pixel unit P is capable of bidirectional charge transfer in the B-direction toward the first horizontal register unit 20 and the A-direction toward the third horizontal register unit 41.

Referring to FIG. 9, description will be given of the operation of this line solid-state imaging device.

First, in time t1 to t2, when a vertical transfer clock is input to the imaging area 10 (a), a charge of the outputting pixel Po of one horizontal line in the imaging region 10 is transferred in the B-direction, that is, to the first horizontal register unit 20, and at the same time, a charge of the detecting pixel Pd of one horizontal line in the imaging region 10 is transferred in the A-direction, that is, to the third horizontal register unit 41. Next, in time t2 to t4, when a clock is input to the first horizontal register unit 20 and the first corner register unit 22 (b), and a clock is input to the second horizontal register unit 24 and the second corner register unit 26 (c), charges of each horizontal register in the first horizontal register unit 20 are sequentially transferred to each horizontal register in the second horizontal register unit 24.

In that case, in time t2 to t3, when a clock is input to the third horizontal register unit 41 (d), charges of each horizontal register in the third horizontal register unit 41 are sequentially transferred to the control unit 50 via the amplifier 42 (e). Then, as described above, by the signal processing circuit 51, based on voltage values sequentially supplied from the third horizontal register unit 41 and the amplifier 42, the pulsed voltage value of a clock to be applied to the electrode P2HB of the multiplication register unit 28 and the direct-current voltage value to be applied to the electrode DCB are determined, and a control signal representing these voltage values is output at time t5 (g). Thereafter, by the driver 52, a clock for the electrode P2HB having a pulsed voltage according to the determined value and a direct-current voltage for the electrode DCB having a voltage according to the value determined by the signal processing unit 51 are generated.

Then, in t6 to t9, the clock and direct-current voltage are supplied to the multiplication register unit 28 from the driver 52 (g), and in time t6 to t7, the clock is input to the second horizontal register unit 24. Then, in time t6 to t7, charges of each horizontal register in the second horizontal register unit 24 are sequentially transferred to each multiplication register in the multiplication register unit 28. Thereafter, in time t7 to t8, charges of each multiplication register in the multiplication register unit 28 are sequentially output to the amplifier 30, and output from the output port (h). In addition, the period of time t8 to t9 in the clock of the multiplication register unit 28 shown in FIG. 9(g) is an over clock period.

Here, the control unit 50, while the charge is retained in the second horizontal register unit 24 (FIG. 9(c), time t2 to t4), determines the multiplication factor of the multiplication register unit 28 according to that charge amount (FIG. 9(f), time t5). That is, the control unit 50, before the charge is input to the multiplication register unit 28 (FIG. 9(g), time t6), determines the multiplication factor of the multiplication register unit 28 according to that charge amount (FIG. 9(f), time t5).

In addition, at time t7, transfer of a charge of next one horizontal line in the imaging region 10 to the first horizontal register unit 20 is started, and the operation described above is repeated.

(Interline Solid-State Imaging Device)

Figure 10:
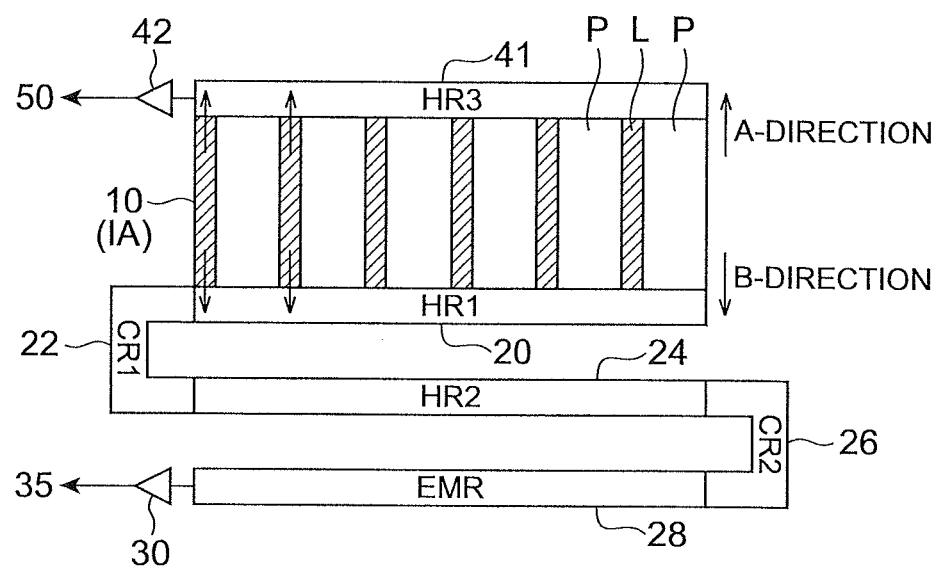
FIG. 10 is a diagram showing a partial configuration of an interline solid-state imaging device.
Figure 11:
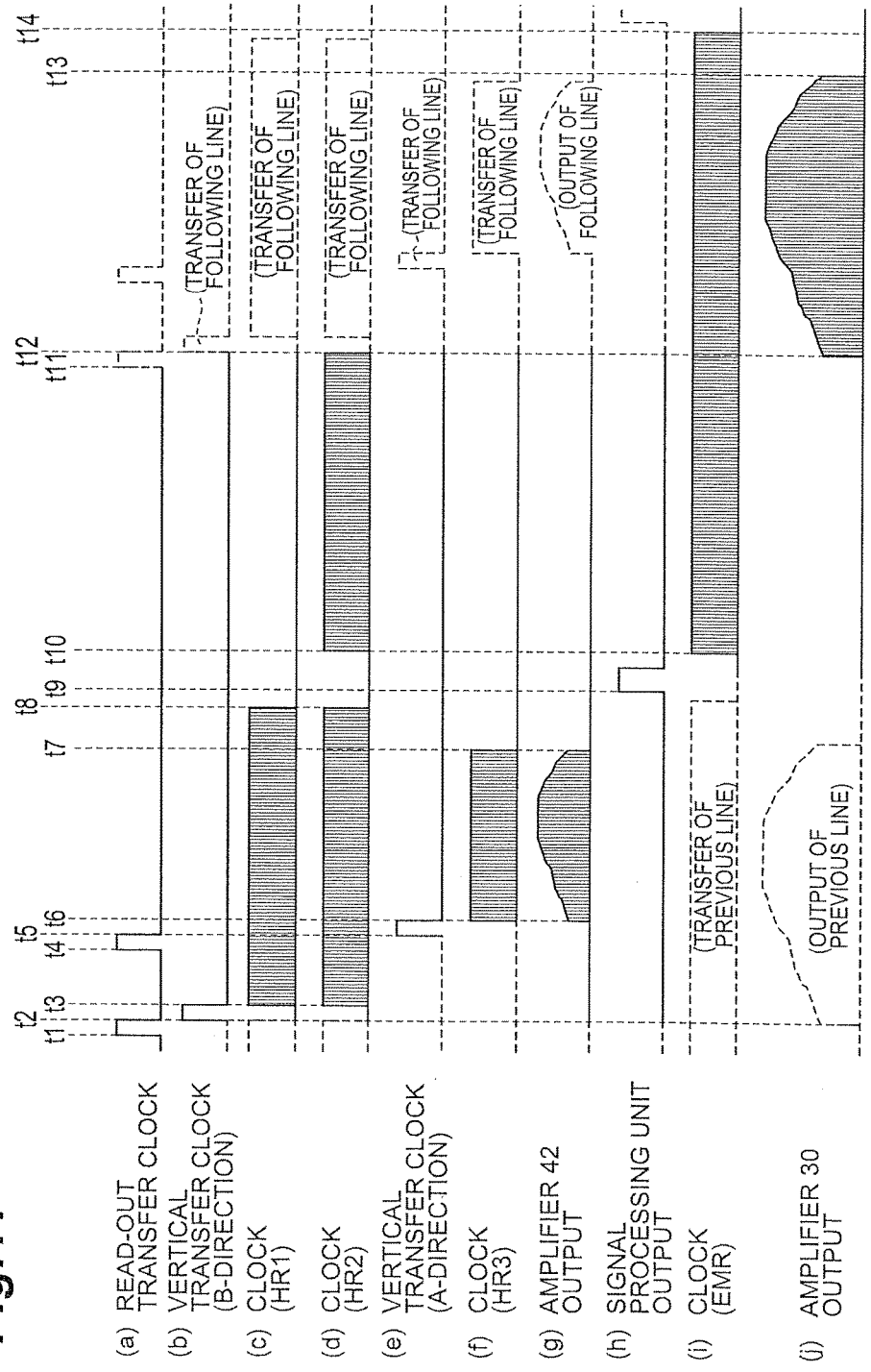
FIG. 11 is a timing chart showing waveforms of the interline solid-state imaging device shown in FIG. 10.

FIG. 10 is a diagram showing a partial configuration of an interline solid-state imaging device, and FIG. 11 is a timing chart showing waveforms of this interline solid-state imaging device.

In the interline solid-state imaging device shown in FIG. 10, the imaging area 10 contains a plurality of pixel units P and a vertical charge transfer channel L that is disposed for every one vertical line of the pixel units P and performs charge transfer. The vertical charge transfer channel L is capable of bidirectional charge transfer in the B-direction toward the first horizontal register unit 20 and the A-direction toward the third horizontal register unit 41, and performs the respective charge transfers alternately.

Referring to FIG. 11, description will be given of the operation of this interline solid-state imaging device.

First, in time t1 to t2, when a read-out transfer clock is input to the imaging area 10 (a), a charge of one horizontal line in the imaging region 10 is transferred to the vertical charge transfer channels L adjacent to each other. Next, in time t2 to t3, when a vertical transfer clock for transfer in the B-direction is input to the imaging area 10 (b), the charge of the vertical charge transfer channel L in the imaging region 10 is transferred to the first horizontal register unit 20. Next, in time t3 to t8, when a clock is input to the first horizontal register unit 20 and the first corner register unit 22 (c), and a clock is input to the second horizontal register unit 24 and the second corner register unit 26 (d), charges of each horizontal register in the first horizontal register unit 20 are sequentially transferred to each horizontal register in the second horizontal register unit 24.

In that case, in time t4 to t5, when a read-out transfer clock is input to the imaging region 10, a charge of the same one horizontal line in the imaging region 10 is transferred to the vertical charge transfer channels L adjacent to each other. Next, in time t5 to t6, when a vertical transfer clock for transfer in the A-direction is input to the imaging area 10 (e), the charge of the vertical charge transfer channel L in the imaging region 10 is transferred to the third horizontal register unit 41. Next, in time t6 to t7, when a clock is input to the third horizontal register unit 41 (f), charges of each horizontal register in the third horizontal register unit 41 are sequentially output to the amplifier 42, and sequentially output to the control unit 50 (g). In addition, the charge transfer of the third horizontal register unit 41 is performed at a higher speed than that of the first horizontal register unit 20.

Then, as described above, by the signal processing circuit 51, based on voltage values sequentially supplied from the third horizontal register unit 41 and the amplifier 42, the pulsed voltage value of a clock to be applied to the electrode P2HB of the multiplication register unit 28 and the direct-current voltage value to be applied to the electrode DCB are determined, and a control signal representing these voltage values is output at time t9 (h). Thereafter, by the driver 52, a clock for the electrode P2HB having a pulsed voltage according to the determined value and a direct-current voltage for the electrode DCB having a voltage according to the value determined by the signal processing unit 51 are generated.

Then, in t10 to t14, the clock and direct-current voltage are supplied to the multiplication register unit 28 from the driver 52 (i), and in time t10 to t12, the clock is input to the second horizontal register unit 24. Then, in time t10 to t12, charges of each horizontal register in the second horizontal register unit 24 are sequentially transferred to each multiplication register in the multiplication register unit 28. Thereafter, in time t12 to t13, charges of each multiplication register in the multiplication register unit 28 are sequentially output to the amplifier 30, and output from the output port (j). In addition, the period of time t13 to t14 in the clock of the multiplication register unit 28 shown in FIG. 11(i) is an over clock period.

Here, the control unit 50, while the charge is retained in the second horizontal register unit 24 (FIG. 11(d), time t3 to t8), determines the multiplication factor of the multiplication register unit 28 according to that charge amount (FIG. 11(h), time t9). That is, the control unit 50, before the charge is input to the multiplication register unit 28 (FIG. 11(i), time t10), determines the multiplication factor of the multiplication register unit 28 according to that charge amount (FIG. 11(h), time t9).

In addition, at time t11, transfer of a charge of next one horizontal line in the imaging region 10 to the first horizontal register unit 20 is started, and the operation described above is repeated.

(Full-Frame Transfer Solid-State Imaging Device)

Figure 12:
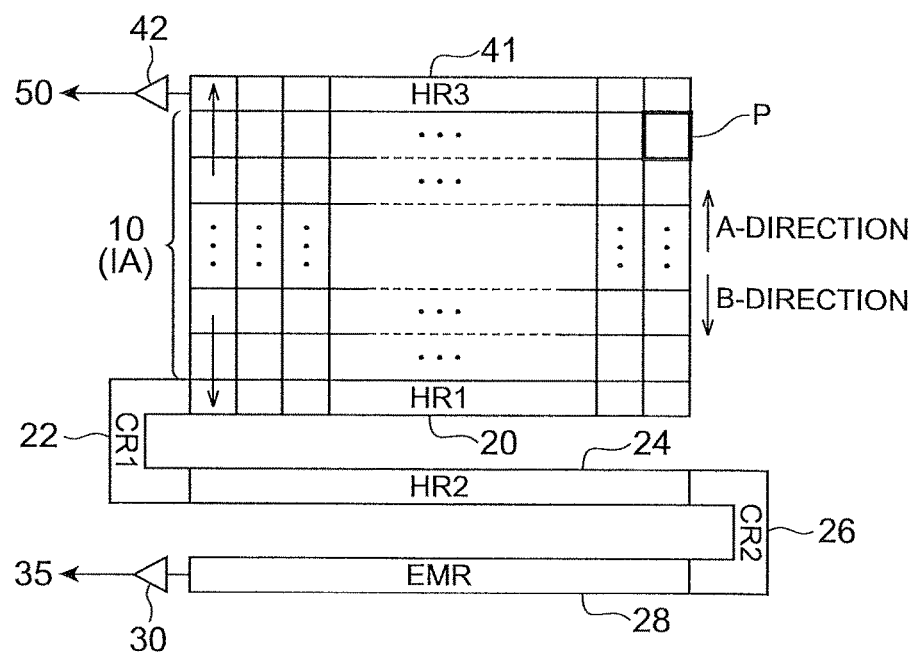
FIG. 12 is a diagram showing a partial configuration of a full-frame transfer solid-state imaging device.
Figure 13:
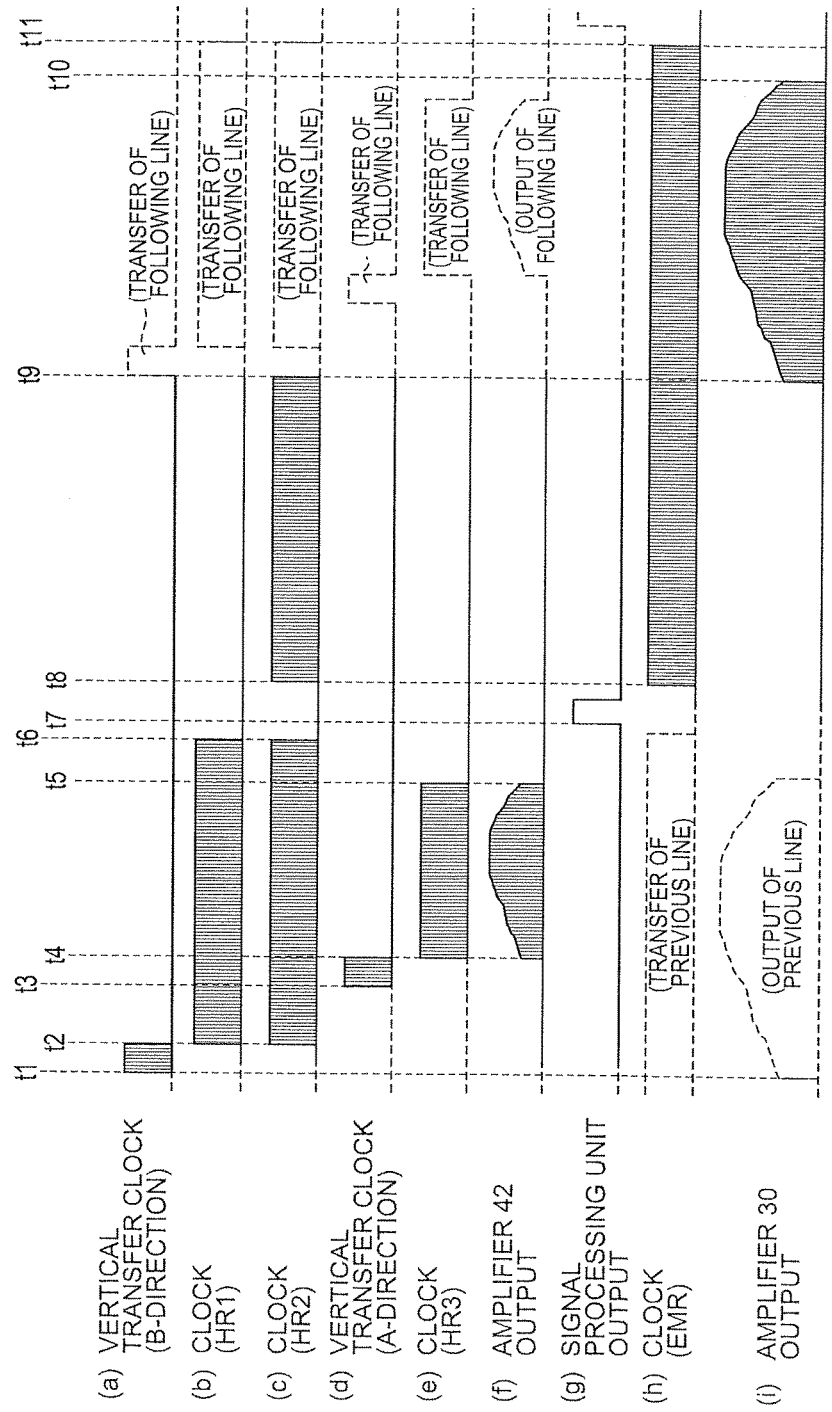
FIG. 13 is a timing chart showing waveforms of the full-frame transfer solid-state imaging device shown in FIG. 12.

FIG. 12 is a diagram showing a partial configuration of a full-frame transfer solid-state imaging device, and FIG. 13 is a timing chart showing waveforms of this full-frame transfer solid-state imaging device.

In the full-frame transfer solid-state imaging device shown in FIG. 12, the imaging area 10 contains a plurality of pixel units P two-dimensionally arrayed in the vertical direction and the horizontal direction. Each pixel unit P is capable of bidirectional charge transfer in the B-direction of the first horizontal register unit 20 and the A-direction toward the third horizontal register unit 41, and performs these charge transfers alternately.

Referring to FIG. 13, description will be given of the operation when this full-frame transfer solid-state imaging device is used as a line sensor by binning.

First, in time t1 to t2, when a vertical transfer clock for transfer in the B-direction is input to the imaging area 10 (a), a charge of every vertical column in the imaging region 10 is transferred to the first horizontal register unit 20. Next, in time t2 to t6, when a clock is input to the first horizontal register unit 20 and the first corner register unit 22 (*b*), and a clock is input to the second horizontal register unit 24 and the second corner register unit 26 (*c*), charges of each horizontal register in the first horizontal register unit 20 are sequentially transferred to each horizontal register in the second horizontal register unit 24.

In that case, in time t3 to t4, when a vertical transfer clock for transfer in the A-direction is input to the imaging area 10 (*d*), a charge of every vertical column in the imaging region 10 is transferred to the third horizontal register unit 41. Next, in time t4 to t5, when a clock is input to the third horizontal register unit 41 (*e*), charges of each horizontal register in the third horizontal register unit 41 are sequentially output to the amplifier 42, and sequentially output to the control unit 50 (*f*). In addition, the charge transfer of the third horizontal register unit 41 is performed at a higher speed than that of the first horizontal register unit 20.

Then, as described above, by the signal processing circuit 51, based on voltage values sequentially supplied from the third horizontal register unit 41 and the amplifier 42, the pulsed voltage value of a clock to be applied to the electrode P2HB of the multiplication register unit 28 and the direct-current voltage value to be applied to the electrode DCB are determined, and a control signal representing these voltage values is output at time t7 (*g*). Thereafter, by the driver 52, a clock for the electrode P2HB having a pulsed voltage according to the determined value and a direct-current voltage for the electrode DCB having a voltage according to the value determined by the signal processing unit 51 are generated.

Then, in t8 to t11, the clock and direct-current voltage are supplied to the multiplication register unit 28 from the driver 52 (*h*), and in time t8 to t9, the clock is input to the second horizontal register unit 24. Then, in time t8 to t9, charges of each horizontal register in the second horizontal register unit 24 are sequentially transferred to each multiplication register in the multiplication register unit 28. Thereafter, in time t9 to t10, charges of each multiplication register in the multiplication register unit 28 are sequentially output to the amplifier 30, and output from the output port (i). In addition, the period of time t10 to t11 in the clock of the multiplication register unit 28 shown in FIG. 13(*h*) is an over clock period.

Here, the control unit 50, while the charge is retained in the second horizontal register unit 24 (FIG. 13(*c*), time t2 to t6), determines the multiplication factor of the multiplication register unit 28 according to that charge amount (FIG. 13(*g*), time t7). That is, the control unit 50, before the charge is input to the multiplication register unit 28 (FIG. 13(*h*), time t8), determines the multiplication factor of the multiplication register unit 28 according to that charge amount (FIG. 13(*g*), time t7).

In addition, at time t9, transfer of a charge of every vertical column in the imaging region 10 to the first horizontal register unit 20 is started, and the operation described above is repeated.

Third Embodiment

Figure 14:
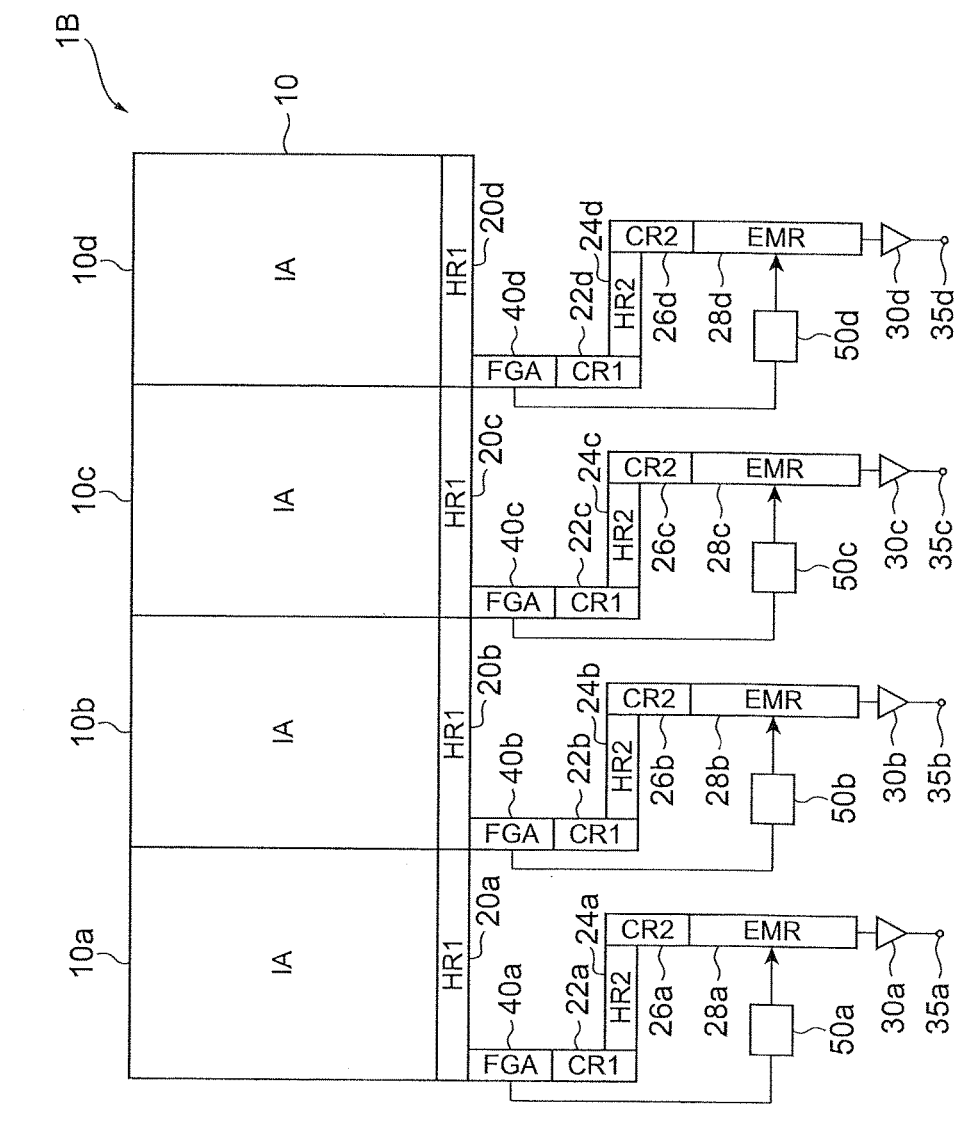
FIG. 14 is a diagram showing a configuration of a solid-state imaging device according to a third embodiment of the present invention.

FIG. 14 is a diagram showing a configuration of a solid-state imaging device according to a third embodiment of the present invention. The solid-state imaging device 1B shown in FIG. 14 is a multi-port solid-state imaging device, and is different from the first embodiment in an aspect of the configuration including four each of first horizontal register units (HR1s) 20, first corner register units (CR1s) 22, second horizontal register units (HR2s) 24, second corner register units (CR2s) 26, multiplication register units (EMIRs) 28, amplifiers 30, output ports 35, detection units 40, and control units 50 in the solid-state imaging device 1.

That is, the solid-state imaging device 1B includes first horizontal register units 20*a*, 20*b*, 20*c*, and 20*d* that receive charges from partial imaging areas 10*a*, 10*b*, 10*c*, and 10*d* in the imaging area 10, respectively, first corner register units 22*a*, 22*b*, 22*c*, and 22*d* that fold back the charge transfer directions from the first horizontal register units 20*a*, 20*b*, 20*c*, and 20*d*, respectively, second horizontal register units 24*a*, 24*b*, 24*c*, and 24*d* that receive charges from the first corner register units 22*a*, 22*b*, 22*c*, and 22*d*, respectively, second corner register units 26*a*, 26*b*, 26*c*, and 26*d* that fold back the charge transfer directions from the second horizontal register units 24*a*, 24*b*, 24*c*, and 24*d*, respectively, multiplication register units 28*a*, 28*b*, 28*c*, and 28*d* that multiply charges from the second corner register units 26*a*, 26*b*, 26*c*, and 26*d*, respectively, amplifiers 30*a*, 30*b*, 30*c*, and 30*d* that output voltages according to the amount of charges received from the multiplication register units 28*a*, 28*b*, 28*c*, and 28*d* to output ports 35*a*, 35*b*, 35*c*, and 35*d*, respectively, detection units 40*a*, 40*b*, 40*c*, and 40*d* that detect the amount of charges from the first horizontal register units 20*a*, 20*b*, 20*c*, and 20*d*, respectively, and control units 50*a*, 50*b*, 50*c*, and 50*d* that control the multiplication factors of the multiplication register units 28*a*, 28*b*, 28*c*, and 28*d*, respectively, based on the amount of charges detected by the detection units 40*a*, 40*b*, 40*c*, and 40*d*.

In the solid-state imaging device 1B of the third embodiment, since feed-forward control of the multiplication factor of the multiplication register unit described above, that is, real-time control of the multiplication factor of the multiplication register unit, is performed port by port, the same advantages as those of the first embodiment can be obtained.

Further, according to the solid-state imaging device 1B of the third embodiment, since parallel processing is performed port by port, speed-up can be realized.

It should be noted that the present invention is not limited to the present embodiments described above, and can be variously modified.

In the present embodiments, the multiplication factor was controlled by adjustment in control voltage of the electrodes of the multiplication register unit, but the multiplication factor may be controlled by controlling the number of multiplication stages of the multiplication register unit. Specifically, the number of stages of multiplication registers having a charge multiplication effect out of a plurality of multiplication registers of the multiplication register unit is controlled. In addition, it suffices to supply multiplication registers not having a charge multiplication effect out of the multiplication registers with a control voltage at so high a level as to perform normal transfer, as described above (the dotted line in FIG. 2(*b*)).

Moreover, in the third embodiment, a multi-port solid-state imaging device including four output ports was exemplified, but the idea of the present invention can be applied to multi-port solid-state imaging devices including two or more output ports. Further, the second embodiment can also be applied to multi-port solid-state imaging devices including two or more output ports.

Moreover, the idea of the present invention can be applied to a variety of forms such as, for example, a line type, an interline type, a frame transfer type, and a full-frame transfer type of solid-state imaging devices, as partially described also in the second embodiment.

INDUSTRIAL APPLICABILITY

The present invention can be applied to a use for appropriately controlling the multiplication factor of the multiplication register unit.

REFERENCE SIGNS LIST 1, 1A, 1B Solid-state imaging device
10 Imaging area
10a, 10b, 10c, 10d Partial imaging area
20, 20a, 20b, 20c, 20d First horizontal register unit (output register unit)
22, 22a, 22b, 22c, 22d First corner register unit
24 24a, 24b, 24c, 24d Second horizontal register unit (delay register unit)
26, 26a, 26b, 26c, 26d Second corner register unit
28, 28a, 28b, 28c, 28d Multiplication register unit
30, 30a, 30b, 30c, 30d Amplifier
35, 35a, 35b, 35c, 35d Output port
40, 40a, 40b, 40c, 40d Detection unit
41 Third horizontal register unit
42 Amplifier
50, 50a, 50b, 50c, 50d Control unit
51 Signal processing unit
52 Driver

The invention claimed is:

1. A charge multiplying solid-state imaging device comprising:
an imaging area that generates a charge according to the amount of incident light;
an output register unit that receives the charge from the imaging area;
a multiplication register unit that multiplies the charge from the output register unit by using an impact ionization effect;
an amplifier that receives the multiplied charge via an output of the multiplication register unit,
the solid-state imaging device performing feed-forward control of a multiplication factor of the multiplication register unit according to the charge amount from the imaging area;
a detection unit that detects the amount of charge to be input to the multiplication register unit;
a control unit that performs feed-forward control of the multiplication factor of the multiplication register unit according to the charge amount detected by the detection unit; and
a delay register unit disposed between the detection unit and the multiplication register unit, for delaying charge transfer from the detection unit to the multiplication register unit.

2. The solid-state imaging device according to claim 1, further comprising a detection register unit that receives the charge from the imaging area, and
a control unit that performs feed-forward control of the multiplication factor of the multiplication register unit according to the amount of charge output from the detection register unit.

3. The solid-state imaging device according to claim 1 or 2, further comprising a delay register unit disposed between the output register unit and the multiplication register unit, for delaying charge transfer from the output register unit to the multiplication register unit.

4. The solid-state imaging device according to claim 1, wherein
the control unit controls the multiplication factor of the multiplication register unit according to any of the maximum value, minimum value, and average value of the amount of charges detected by the detection unit.

5. The solid-state imaging device according to claim 2, wherein
the control unit controls the multiplication factor of the multiplication register unit according to any of the maximum value, minimum value, and average value of the amount of charges output from the detection register unit.

6. The solid-state imaging device according to claim 1, wherein
the detection unit includes a floating gate amplifier.

7. A charge multiplying solid-state imaging device comprising:
an imaging area that generates a charge according to the amount of incident light;
a plurality of output register units that receive the charge from the imaging area;
a plurality of multiplication register units that multiply the charges from the output register units, respectively;
a plurality of amplifiers that receive the multiplied charges via outputs of the multiplication register units,
the solid-state imaging device performing feed-forward control of multiplication factors of the multiplication register units, respectively, according to the amount of charges to be input to the multiplication register units, respectively,
a plurality of detection units that respectively detect the amount of charges to be input to the multiplication register units, respectively,
a plurality of control units that respectively perform feed-forward control of the multiplication factors of the multiplication register units, respectively, according to the charge amounts detected by the plurality of detection units, respectively, and
a plurality of delay register units, respectively disposed between the respective detection units and the respective multiplication register units, for delaying charge transfer from the detection units to the multiplication register units, respectively.

* * * * *